(12) United States Patent
Kahn et al.

(10) Patent No.: US 6,682,634 B1
(45) Date of Patent: Jan. 27, 2004

(54) APPARATUS FOR SPUTTER DEPOSITION

(75) Inventors: James R. Kahn, Ft. Collins, CO (US); Harold R. Kaufman, LaPorte, CO (US); Viacheslav V. Zhurin, Ft. Collins, CO (US); David A. Baldwin, Annandale, VA (US); Todd L. Hylton, Great Falls, VA (US)

(73) Assignees: Kaufman & Robinson, Inc., Ft. Collins, CO (US); Veeco Instruments Inc., Plainview, NY (US)

( * ) Notice: Subject to any disclaimer, the term of this patent is extended or adjusted under 35 U.S.C. 154(b) by 635 days.

(21) Appl. No.: 09/471,662

(22) Filed: Dec. 23, 1999

Related U.S. Application Data

(63) Continuation-in-part of application No. 09/078,727, filed on May 14, 1998, now abandoned.

(51) Int. Cl.$^7$ .............................................. C23C 14/00
(52) U.S. Cl. ........................ 204/192.11; 204/298.04; 204/298.07; 204/298.12
(58) Field of Search ................... 204/192.11, 298.04, 204/298.05, 298.07, 298.08, 298.11, 298.12

(56) References Cited

U.S. PATENT DOCUMENTS

| | | | | |
|---|---|---|---|---|
| 3,156,090 A | * | 11/1964 | Kaufman | 60/202 |
| 4,108,751 A | * | 8/1978 | King | 204/192.11 |
| 4,376,688 A | * | 3/1983 | Ceasar et al. | 204/192.11 |
| 4,693,805 A | * | 9/1987 | Quazi | 204/192.22 |
| 4,747,922 A | * | 5/1988 | Sharp | 204/192.11 |
| 4,911,809 A | * | 3/1990 | Wort et al. | 204/192.11 |
| 5,423,971 A | * | 6/1995 | Arnold et al. | 204/298.11 |

OTHER PUBLICATIONS

Ion Beam Neutralization, CSC Technical Note, pp. 4, 5 and 11.*

* cited by examiner

Primary Examiner—Patrick Ryan
Assistant Examiner—Julian Mercado
(74) Attorney, Agent, or Firm—Dean P. Edmundson

(57) ABSTRACT

In accordance with one specific embodiment of the present invention, the apparatus for sputter deposition within an evacuated volume comprises a compact ion source to generate ions into which an ionizable gas is introduced and from which ions leave with directed energies near or below the sputtering threshold, a sputter target near that source and located within the beam of ions leaving that source, a sputter target with a grounded shield that defines the target portion exposed to sputtering, and a power supply to bias the target negative relative to ground so that ions are attracted to and sputter the target. Particles sputtered from the target are deposited on a deposition substrate separate from both the ion source and the sputter target. For an insulating target, the target is biased with a radiofrequency power supply and the bias has a mean negative value rather than a direct-current negative value relative to ground. The rate and energy with which the ions arrive at the target determine the rate with which that target is sputtered and the deposition rate on the substrate. In using a compact gridless ion source, the high pressure required for generating ions is confined to the ion source, reducing the pumping gas load. For ion energies at or near the sputtering threshold, the sputtering from extraneous hardware is reduced or eliminated. In addition, the target biases can be low enough to minimize the damage due to energetic neutrals that result from reflection of energetic target ions.

1 Claim, 3 Drawing Sheets

APPARATUS FOR SPUTTER DEPOSITION

CROSS-REFERENCE TO RELATED APPLICATION

This is a continuation-in-part of our application Ser. No. 09/078,727, filed May 14, 1998 now abandoned.

FIELD OF INVENTION

This invention relates generally to the deposition of thin films, and more particularly to the deposition of thin films with low contamination by extraneous materials and low damage due to bombardment by energetic ions or neutrals.

This invention can find application in a variety of thin film applications such as the deposition of decorative or protective films, the deposition of conducting films for solid state electronics, or the deposition of magnetic films for recording heads or recording media.

BACKGROUND ART

Sputter deposition is widely used for the deposition of thin films. The most closely related prior art is the sputter deposition from a target that results from an energetic beam of ions being directed against that target. The most widely used ion source for such an application is the gridded ion source described in an article by Kaufman, et al., in the *AIAA Journal*, Vol. 20 (1982), beginning on page 745, incorporated herein by reference. Although it would be less likely, a gridless ion source could also be used. The end-Hall type of gridless ion source is described in U.S. Pat. No. 4,862,032-Kaufman, et al., while the closed-drift type of gridless ion source is described in U.S. Pat. No. 5,359,258-Arkhipov, et al., both of which are incorporated herein by reference. The primary advantage of such sputter deposition apparatus is the low pressure that is possible at the deposition substrate. The high pressure required for the generation of ions is confined to the inside of the ion source. The total gas flow is thereby reduced, compared to having the entire volume within the vacuum enclosure at high pressure, and moderate pumping permits the deposition substrate to be maintained at a low background pressure.

There are other means of depositing thin films using sputter deposition. One is radiofrequency sputtering as described by Maissel in Chapter 4 of *Handbook of Thin Film Technology* (Maissel and Glang, eds.), McGraw-Hill Book Company, New York, 1970. Another is the magnetron as described in the article by Thornton in *the Journal of Vacuum Science and Technology*, Vol. 15 (1978), beginning on page 171, or an improved magnetron as described in U.S. Pat. No. 4,588,490-Cuomo, et al. These other means of sputter deposition operate at higher background pressures and are therefore subject to contamination of the thin film that is deposited with background gases.

There are problems with the prior art of sputter deposition from a target using an energetic beam of ions against that target.

One problem is that the ion beam generated by the ion source must be directed only at the sputter target. Even with carefully machined and expensive ion optics grids, it is common for some energetic ions to strike other hardware besides the target and thereby introduce contamination into the deposited film.

Another problem is the reflection of energetic neutrals from the sputter target. Energetic ions become neutralized in striking the target, and are reflected diffusely to strike the thin film being deposited on the substrate. These collisions with the substrate introduce damage sites in the deposited film.

Yet another problem is the reduced ion current capacity of ion optics for gridded ion sources at energies low enough to minimize the above problem of energetic neutral reflection. As described in the above article by Kaufman, et al., in the *AIAA Journal*, the ion current capacity of these ion optics varies approximately as the three-halves power of the voltages. Operation at low ion voltages—and energies—therefore severely restricts the ion beam current and thus the process rate.

A related problem is the large gas flow required to operate a gridded ion source when the source must be large to offset the reduction in ion current capacity due to operating the source at low voltages.

In summary, complicated and expensive apparatus is required for sputter deposition with energetic ion beams. Attempts to reduce the damage due to energetic neutrals by reducing the ion energy can result in an increase in the size of the ion source used which, in turn, can result in the increase of the gas flow and a need for larger, more expensive vacuum pumps.

SUMMARY OF INVENTION

In light of the foregoing, it is an overall general object of the invention to provide an improved apparatus that confines the high pressure required for ion generation to an ion source and deposits thin films in a low background pressure.

Another object of the present invention is to provide an apparatus that minimizes the overall gas flow required and thereby reduces the vacuum pumping requirement.

A further object of the present invention is to provide an apparatus that minimizes the sputtering that results from ions striking components of the apparatus other than the sputter target.

Yet another object of the present invention is to provide an apparatus in which the energies of the ions striking the target are low enough to minimize the damage by reflected energetic neutrals, without the ion current restrictions of gridded ion optics at low ion energies.

A more specific object of the present invention is to avoid any need for expensive ion optics grids.

Another more specific objective of the present invention is to carry out the deposition at a background pressure that is substantially (a factor of two or more) less than the pressure within the ion source.

In accordance with one specific embodiment of the present invention, the apparatus for sputter deposition within an evacuated volume comprises a compact gridless ion source to generate a beam of ions into which an ionizable gas is introduced and from which ions leave with directed energies at or near the sputtering threshold, a sputter target near that source and located within the beam of ions leaving that source, a grounded shield surrounding the sputter target and defining that portion of the target which is to be exposed to sputtering, and a power supply to bias the target negative relative to ground so that ions are attracted to and sputter only the target. Ground is defined as the potential of the surrounding vacuum enclosure, which is typically at earth ground. Particles sputtered from the target are deposited on a deposition substrate separate from both the ion source and the sputter target.

In the case of an insulating target, the target is biased with a radiofrequency power supply and the bias has a mean negative value rather than a direct-current negative value relative to ground. The rate with which ions arrive at the sputter target is controlled by the rate with which the ions are generated by the ion source, while the energy with which these ions strike the target is controlled by the target bias. The rate and energy with which the ions arrive at the target together determine the rate with which that target is sputtered and the rate at which the thin film is deposited on the substrate.

In using a compact gridless ion source, the high pressure required for generating ions is confined to the ion source and the gas load for pumping is reduced. For ion energies at or near the sputtering threshold, the sputtering from extraneous hardware is reduced or eliminated. In addition, the target biases can be low enough to minimize the damage due to energetic neutrals that result from the reflection of energetic ions striking the target.

DESCRIPTION OF FIGURES

Features of the present invention which are believed to be patentable are set forth with particularity in the appended claims. The organization and manner of operation of the invention, together with further objectives and advantages thereof, may be understood by reference to the following descriptions of specific embodiments thereof taken in connection with the accompanying drawings in which:

It may be noted that the aforesaid schematic cross-sectional views represent the surfaces in the plane of the section while avoiding the clutter which would result were there also a showing of the background edges and surfaces of the overall assemblies.

DESCRIPTION OF PRIOR ART

Figure 1:
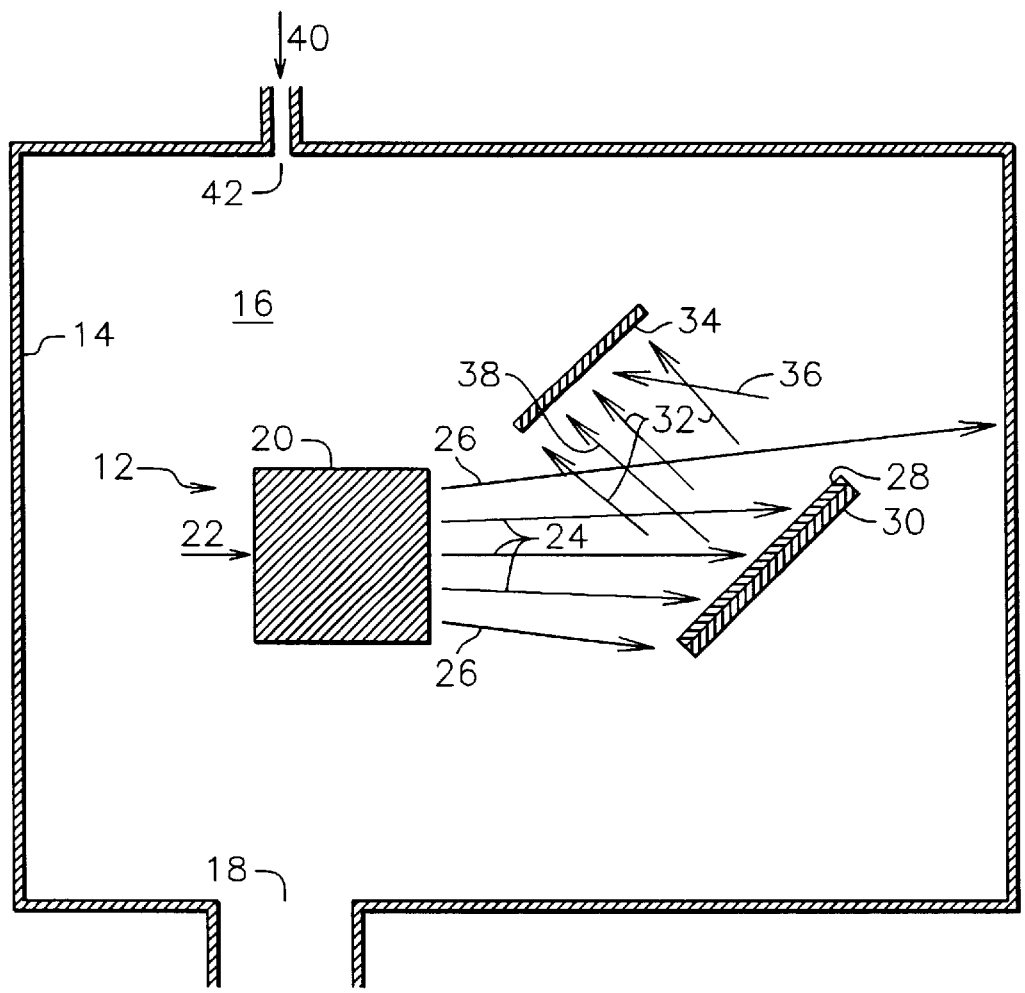
FIG. 1 is a schematic cross-sectional view of a prior-art apparatus for the sputter deposition of thin films.

Referring to FIG. 1, there is shown a schematic cross sectional view of prior art apparatus 12 for sputter deposition. As is customary with apparatus for sputter deposition, a grounded vacuum enclosure 14 surrounds an evacuated volume 16, which is maintained at a rarefied pressure by pumping through a port 18. Within the evacuated volume is an ion source 20 which is shown in simplified block form because a variety of ion source designs could be used. An ionizable gas 22 is introduced into ion source 20. Energetic ions are generated from the ionizable gas 22 by ion source 20 and flow outward in a central beam 24 and in a fringe beam 26. The energetic ions of the central beam 24 strike a sputter target 28, which is in physical and electrical contact with a grounded target support 30. It is frequently necessary to cool the target and target support, using a technology that is well-known to those skilled in the art. There is an efflux of sputtered particles 32 from the target 28. Some of these sputtered particles strike a deposition substrate 34, causing a thin film of target material to be deposited thereon.

The quality of the film deposited by the apparatus shown in FIG. 1 is limited by the inclusion of contaminants or damage sites in that film.

The reduction of gaseous contaminants included in the deposited film is accomplished by carrying out the deposition at low pressure—approximately $1 \times 10^{-3}$ Torr or lower (approximately 0.1 Pascal or lower)—depending on the level of purity required in the deposited film. To minimize the pumping required to maintain a low operating pressure, it is important that the efflux of neutral gas from the ion source 20 be minimized. The neutral gas efflux from the ion source equals the difference between the gas flow 22 to the ion source and the gas flow required to form the ion beam 24 and 26. The gas required for the ion beam 24 and 26 is necessary for the sputtering process. The neutral efflux, however, results in the need for a neutral density to sustain the electrical discharge that makes the ions. From the scaling of collision path lengths with the diameter of a gridded ion source, the minimum neutral density within an ion source that is required to sustain an electrical discharge varies inversely with the source diameter, D. (This is evident from Equation (6) in the aforesaid article by Kaufman, et al., in the *AIAA Journal*, where the ratio $A_p/\Omega_p$ is proportional to 1/D for ion sources of different sizes, but similar shapes.) The area for efflux of the neutral gas varies as the square of the source diameter, $D_2$, again for ion sources of different sizes, but similar shapes. The neutral efflux varies as the area times the pressure, hence it varies in proportion to the source diameter, D. The total gas flow rate for a given ion beam current can therefore be minimized by using a small gridded ion source 20.

A similar line of reasoning can be used to show that the neutral efflux varies in proportion to the source diameter, D, if the ion source is the end-Hall type of gridless ion source as described in U.S. Pat. No. 4,862,032-Kaufman, et al. If the ion source is the closed-drift type of gridless ion source, as described in U.S. Pat. No. 5,359,258-Arkhipov, et al., the neutral efflux varies with the mean diameter of the channel, although the logic is somewhat different due to the annular shape. In all ion sources that have been studied, then, the neutral efflux from an ion source is reduced by making the ion source more compact.

The reduction of solid contaminants that are included in the deposited film is accomplished by minimizing the sputtering from extraneous hardware. Some of the energetic ions in the fringe beam 26 strike hardware other than the sputter target 28, shown by example in FIG. 1 as striking the vacuum enclosure 14. There are sputtered particles from this fringe beam, and some of these sputtered particles 36 reach the deposition substrate 34 and are incorporated within the deposited film. To minimize the inclusion of contaminants, it is necessary that the fringe beam 26 be minimized. This is generally accomplished by using a gridded ion source of the general type described in the aforesaid article by Kaufman, et al., in the *AIAA Journal*. It should be noted that a variety of gridded ion sources may be used as the ion source 20 in FIG. 1, including different numbers of grids, different magnetic-field shapes for direct-current discharges, and, although not described in the aforesaid article by Kaufman, et al., radiofrequency discharges may also be used to generate the ions.

Even in the most well-defined beam from a gridded ion source of this general type, there are fringe ions that strike other hardware and contribute to contamination of the deposited film. Sometimes the ion beam is passed through an aperture that intercepts all energetic ions except the central beam 24. In that case, the material out of which the aperture is formed becomes a source of extraneous sputtering and contamination. The fringe beam 26 thus constitutes a serious contamination problem.

In addition to the reduction of included contaminants, it is often necessary to reduce the damage sites in the deposited film. These damage sites are caused by the collisions of energetic neutrals 38 with the deposited film and can cause either disruptions of the film or mixing of the film with the substrate. The energetic neutrals 38 come from energetic ions in the ion beam 24 and 26 that strike the sputter target 28 and other objects and are reflected diffusely from collisions with the atoms therein. The energy of the incident ions is typically 800–1200 eV when gridded ion sources are used, corresponding to 800–1200 V for the voltage of the beam supply.

The reflection of energetic ions can in some cases be reduced by using ionizable gases with greater atomic weights, such as krypton or xenon instead of argon. In collisions with atoms of target material, the heavier ions will be more likely to continue forward into the target, rather than be reflected from it. The damage that can be done by energetic neutrals, however, can be more directly reduced by reducing the energy of the incident ions 24 and 26.

Figure 2:
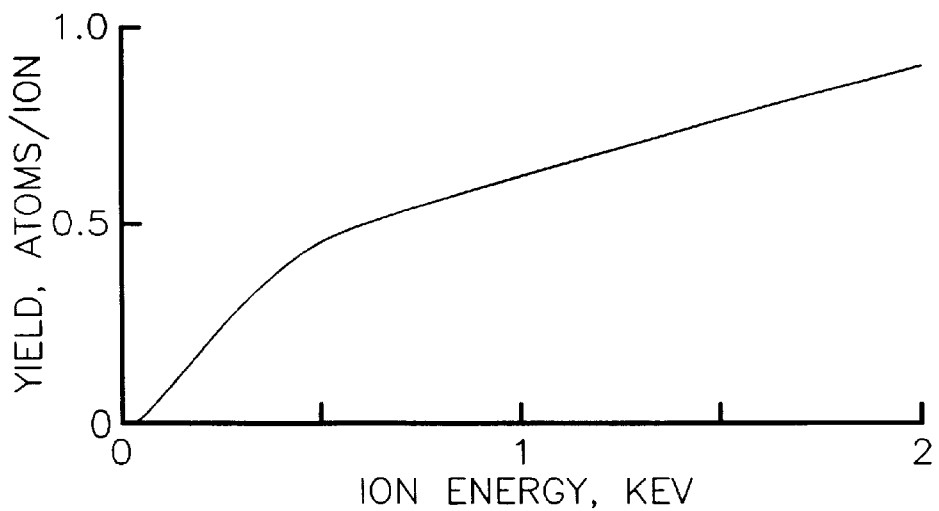
FIG. 2 is the experimental variation of sputter yield in atoms per incident ion for argon ions striking silicon.
Figure 3:
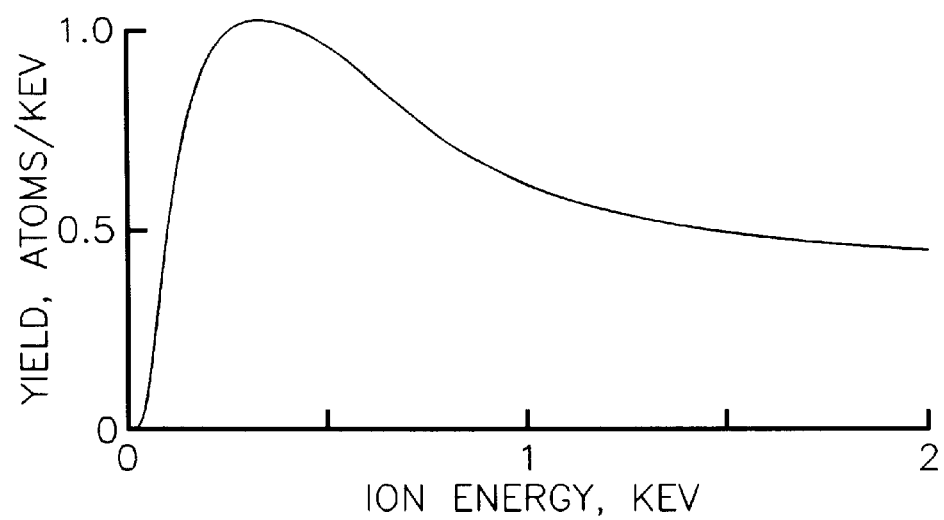
FIG. 3 is the experimental variation of sputter yield in atoms per incident keV (kilo-electron-volt) for argon ions striking silicon.

Referring to FIGS. 2 and 3, the experimental sputtering characteristics are shown for argon ions striking silicon. The curves shown in FIGS. 2 and 3 were obtained from the experimental sputtering data disclosed by H. R. Kaufman et al. in *Operation of Broad-Beam Source*, Commonwealth Scientific Corporation, Alexandria, Va., 1984, Chapt. 16, and the references included therein. Although the specific values are valid only for silicon with argon ions striking at normal incidence, the curves are qualitatively correct for most materials that are sputtered over a range of incidence angles. In FIG. 2, the sputter yield in atoms per incident ion is shown as a function of the incident ion energy. This sputter yield is seen to rise steeply up to 300–500 eV (0.3–0.5 keV), then rise more gradually at higher energies. There is ultimately a decrease in sputter yield at a sufficiently high energy that is beyond the range of interest here.

The sputter yield of FIG. 2 has been divided by the ion energy to give a sputter yield in atoms per keV of incident ion energy in FIG. 3. In terms of incident ion energy, the most efficient range for ion sputtering is seen to be 300–500 eV, which corresponds to 300–500 V for the beam supply of a gridded ion source. The sputtering process, by itself, is thus no obstacle to using low energy ions.

The obstacle to using low ion energies and low beam voltages in gridded sources is in the space-charge limit of the ion optics used. As described in the aforesaid article by Kaufman, et al., in the *AIAA Journal*, the current capacity of the ion optics varies as the three-halves power of the voltage between the grids. While there are some variations in grid design and operating conditions that can be used, the ion beam current capacity of gridded ion optics is severely limited at low beam voltages.

There are also gridless types of ion sources as described in U.S. Pat. No. 4,862,032-Kaufman, et al. Gridless ion sources are not subject to space-charge limitations because the ion acceleration takes place in a quasi-neutral plasma. Gridless ion sources can therefore be operated at high ion currents with low ion energies. Unfortunately, it is more difficult to control the trajectories of ions in gridless ion sources and the fringe beam 26 in FIG. 1 is a much more serious problem when the ion source 20 is of the gridless type. The use of a gridless ion source is thus seen to be beneficial in obtaining useful ion beam currents at low ion energies, but to be detrimental in having more ions in the fringe beam 26.

It is also important to consider the use of reactive deposition in the prior art. Returning to FIG. 1, a reactive gas 40 may be introduced through auxiliary port 42. Energetic sputtered particles 32 can combine with the reactive gas at the deposition substrate 34 to form a deposited film that is a compound of the sputtered material and the reactive gas. As described in an article by Wei, et al., in the *SPIE Proceedings*, Vol. 1047 (Mirror and Windows for High Power/High Energy Laser Systems), 1989, beginning on page 211, a careful balance of the reactive and ion source gas flows is required to avoid coating the sputter target with the same compound that is being deposited and thereby reducing the rate of sputtering from the target.

DESCRIPTION OF THE PREFERRED EMBODIMENTS

Figure 4:
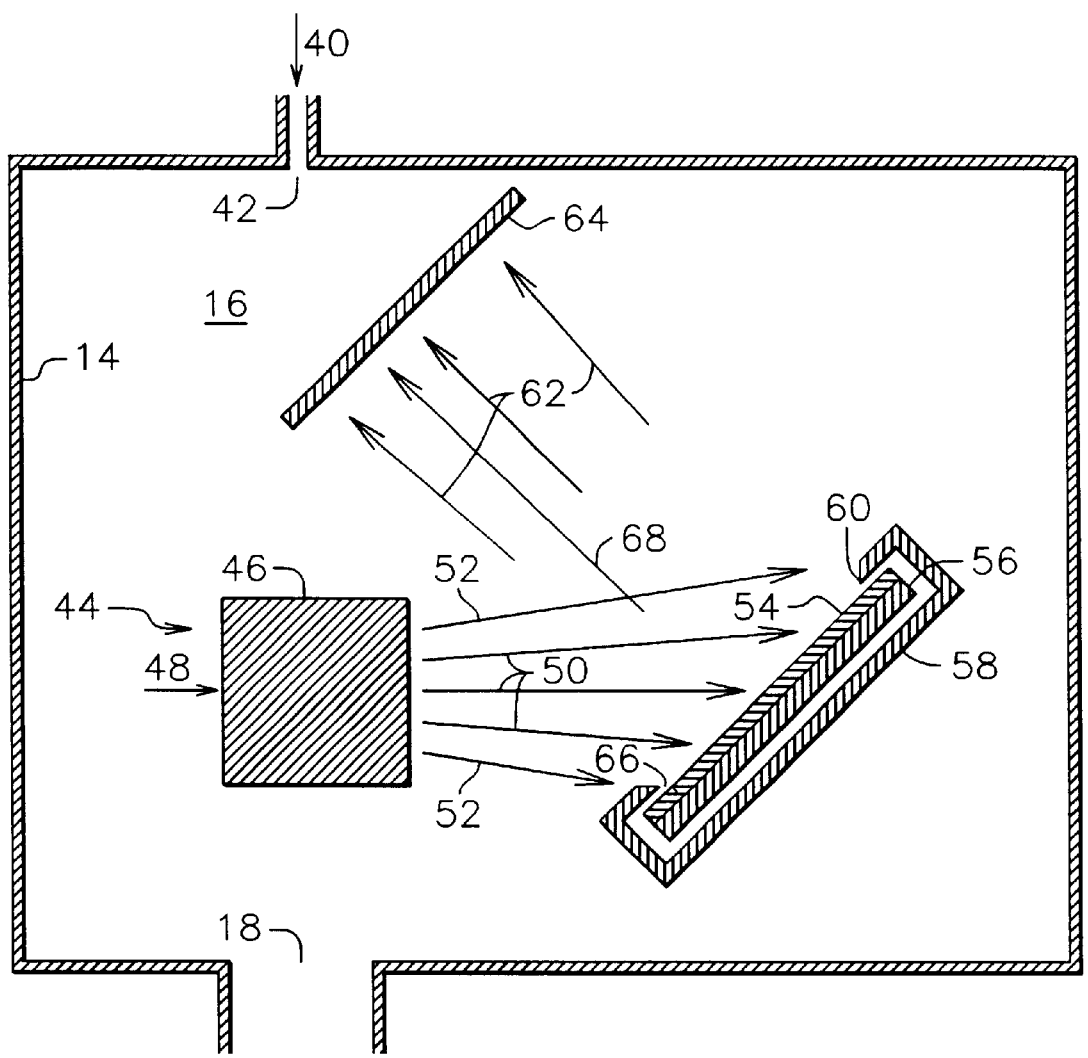
FIG. 4 is a schematic cross-sectional view of an apparatus for sputter deposition constructed in accordance with a specific embodiment of the present invention.

Referring to FIG. 4, there is shown a schematic cross-sectional view of an apparatus 44 for sputter deposition constructed in accordance with a specific embodiment of the present invention. As is customary with apparatus for sputter deposition, a grounded vacuum enclosure 14 surrounds an evacuated volume 16, which is maintained at a rarefied pressure by pumping through a port 18. In the apparatus for sputter deposition there is an ion source 46 which is shown in simplified block form because a variety of ion source designs could be used, many of which are commercially available. An ionizable gas 48 is introduced into ion source 46. Energetic ions are generated from the ionizable gas 48 by ion source 46 and flow outward in a central ion beam 50 and in a fringe ion beam 52, with all ions having energies of about 50 eV or less. The central ion beam is directed at sputtering target 54 which is in physical contact with target support 56 and partially enclosed by grounded target enclosure 58. The target support may be cooled, using a technology that is well-known to those skilled in the art. Energy is supplied to the ions that reach target 54 by biasing target support 56 and target 54 in electrical and physical contact with the target support to a negative potential relative to ground. The edge 60 of the target enclosure 58 defines the outer edge or perimeter of the area of target 54 that is exposed for sputtering. Sputtered particles 62 from the target 54 are deposited to form a thin film on deposition substrate 64. To keep the ions from ion beam 50 and 52 from penetrating behind the edge 60 of target enclosure 58, the spacing 66 between the target 54 and the target enclosure 58 should be approximately equal to or less than the plasma sheath thickness at the target.

The preceding discussion of FIG. 4 implies that target 54 is a conductor and that the negative bias relative to ground applied to target support 56 and target 54 is a direct-current potential. It should be noted that the target 54 may also be an insulator. For such a target, the target bias applied to the target support 56 should be a radiofrequency bias. The time-averaged current to the exposed surface of target 54 should then be zero. As is well-known from studies of radiofrequency plasma diodes, the zero time-averaged current is achieved with very short portions of the cycles during which there is a net collection of the more mobile electrons, and much longer portions of the cycles during which there is a net collection of the less mobile ions. In this manner, the time-averaged voltage of the exposed surface of the target 54 is sufficiently negative relative ground to achieve sputtering. The relative mobilities of electrons and ions that give rise to this effect in radiofrequency sputtering are described by Maissel in the aforesaid Chapter 4 of *Handbook of Thin Film Technology*.

The low energy of the ion beam 50 and 52 is critical to the operation of the sputtering apparatus of FIG. 4. The threshold for sputtering by ions is typically in the range of 20–30 eV, so that negligible sputtering will take place when ions having sputtering threshold energy or less strike grounded hardware, with ground again defined as the potential of the surrounding vacuum enclosure 14. This means that the fringe ion beam 52 is greatly reduced in significance for contamination and, for example, an end-Hall type of gridless ion source as described in U.S. Pat. 4,862,032-Kaufman, et al., may be used instead of a gridded ion source of the type described in the aforesaid article by Kaufman, et al., in the *AIAA Journal*. In practice, the acceptable energy level for ions leaving ion source 46 will depend on the needs of the specific sputtering application. For applications requiring the highest purity, the ion energy should be at or below the sputtering threshold. For applications requiring only moderate purity, the ion energy could easily be higher by ten or twenty eV.

It should be noted that, for a substantial flow of low-energy ions to leave the ion source, electrons must be present in approximately equal numbers to the ions. This is the well-known plasma condition of quasineutrality. The efflux from the ion source can therefore be described either as an ion beam or a plasma beam. Further, the ion trajectories are strongly affected by the potential distribution within the plasma at these low ion energies, resulting in poorly defined ion trajectories. For example, ions with an translational energies approaching the electron thermal energy can and do flow around corners.

The use of a gridless ion source for ion source 46 in the apparatus 44 of FIG. 4 has multiple advantages:

The gridless ion source is simpler and less expensive than a gridded source of similar ion beam current capacity.

The gridless ion source has no space-charge limitation on ion beam current, hence it can generate large ion beam currents at low ion energies. This means that a gridless ion source can be smaller than a gridded source for the same ion beam current at low ion energies. The use of a small gridless source at low ion energies therefore permits the neutral efflux and the pumping requirement for maintaining a given pressure within the vacuum enclosure to both be minimized.

The use of a gridless ion source also permits the damage due to energetic neutrals 68 striking the deposited film to be reduced by reducing the energy with which ions strike the target—typically to the 300–500 eV range.

Control of the embodiment of the present invention indicated in FIG. 4 is straightforward. The negative bias of the sputter target 54 relative to ground determines the energy of the ions in ion beam 50, and therefore the sputter yield per incident ion. This negative bias may be a direct-current bias for a target that is a conductor or it may be a time-averaged radiofrequency bias for a target that is an insulator. In either case, the magnitude of the bias can be adjusted to reduce the energy of the energetic neutrals 68 at the deposition substrate to an acceptable value. The sputter rate of the target and the deposition rate at the substrate are then adjusted by increasing or decreasing the ion beam current from the ion source.

ALTERNATE EMBODIMENTS

A variety of alternate embodiments are evident to one skilled in the art. Different types of ion and plasma sources may be used to generate a low energy beam of ions. For example, a source similar to a gridded ion source, but with the ion-optics grids removed, would generate the desired ion beam. For a small efflux of low energy ions, the ion source could be a commercially available plasma bridge cathode or a hollow cathode, as described in the technical note, "Ion Beam Neutralization," Commonwealth Scientific Corporation, 1991, U.S. Pat. No. 3,515,932-King, or U.S. Pat. No. 3,523,210-Ernstene, et al., incorporated herein by reference. These cathodes are normally used for electron emission, but they depend on an efflux of low energy ions to neutralize the space charge of the electron emission. In using such a cathode in an alternate embodiment of this invention, it would be the ion efflux that would be of interest, not the electron emission.

The shape of the target 54 in FIG. 4 was not specified, but might be expected to be circular or elliptical because circular or elliptical shapes are often used for targets in ion beam sputtering applications. Depending on the specific need, an elongated or rectangular target may be useful. Several small ion sources spaced along the target could give the optimum gas flow configuration for an elongated target. Multiple targets could be used, either moving the appropriate target into position as needed, or having all targets close to the ion source and biasing targets as needed, Other possibilities of tailoring the configuration of the sputter target to specific needs should be readily apparent.

The shape of the deposition substrate 64 in FIG. 4 was not specified, but could be any of a wide range of shapes. For example, the substrate could be the moving web in a web coater, being unrolled from one roller and, after deposition, being rolled up on another roller. Alternatively, the deposition could be a three-dimensional shape that must be rotated in various directions to assure deposition coverage on all surfaces. Other possibilities of tailoring the configuration of the deposition substrate to specific needs should be readily apparent.

Sputter targets that are either conductors or insulators have been considered in the use of either direct-current or radiofrequency biasing of the target. It should be obvious to those skilled in the art that the biasing can also take other forms, such as pulsed direct current, as described in the technical note, "Asymmetric Bipolar Pulsed DC," ENI, 1996.

It should be noted that operation with radiofrequency or pulsed biasing of the target may result in additional ion generation near the target, beyond that generated by the ion source. This enhancement of ion generation depends on the background pressure near the target, and is negligible at a low enough background pressure. At the pressures of interest herein—approximately $1 \times 10^{-3}$ Torr or lower (approximately 0.1 Pascal or lower)—this effect is small enough that the ion collection by the sputter target will cease if the ion source discharge stops.

Sputter targets may also be magnetically permeable. Many ion sources are insensitive to the magnetic permeability of nearby objects, including the gridless source described in U.S. Pat. No. 4,862,032-Kaufman, et al., as long as the background magnetic field near the ion source is small.

Reactive deposition is also possible as an alternate embodiment. Returning to FIG. 4, a reactive gas 40 may be introduced through auxiliary port 42. Energetic sputtered particles 62 can combine with the reactive gas at the deposition substrate 64 to form deposited film that is a compound of the sputtered material and the reactive gas. The techniques of using a reactive background gas in sputter deposition are well known and are described in the aforesaid article by Wei, et al., in the SPIE Proceedings.

SPECIFIC EXAMPLE

As a specific example of operation, a configuration similar to that shown in FIG. 4 was operated with a commercial end-Hall ion source constructed in accord with U.S. Pat. No.

4,862,032-Kaufman, et al., commercially available as Mark I from Commonwealth Scientific Corporation, Alexandria, Va. This ion source had an external diameter of 64 mm and an overall length including cathode of 106 mm. The target diameter was 95 mm. The extension of the centerline of the ion source passed through the center of the target and had an incidence angle of 45 degrees with that target, approximately as shown in FIG. 4. The ion source was spaced 80 mm from the center of the target. The discharge current of the ion source was 1.0 ampere at a discharge voltage of 38 volts and an argon gas flow of 11 sccm (standard cubic centimeters per minute). The mean ion energy at that discharge voltage was estimated at 20–25 eV. The low discharge voltage was achieved with an electron emission from the cathode of 2.85 amperes. The deposition rate for copper at a substrate located 200 mm from the center of the target was 32 angstroms per minute with a negative target bias of 500 V relative to the surrounding grounded vacuum chamber. The background pressure in the evacuated volume was $5.3 \times 10^{-4}$ Torr ($7.0 \times 10^{-2}$ Pascal) while the pressure inside the Mark I ion source was calculated as greater than $3 \times 10^{-3}$ Torr (0.4 Pascal).

While particular embodiments of the present invention have been shown and described, and various alternatives have been suggested, it will be obvious to those of ordinary skill in the art that changes and modifications may be made without departing from the invention in its broadest aspects. Therefore, the aim in the appended claims is to cover all such changes and modifications as fall within the true spirit and scope of that which is patentable.

We claim:

1. A method for sputtering material from a sputter target onto a deposition substrate in an evacuated volume, the method comprising the steps of:

(a) providing an ion source means, with means for introducing a gas, ionizable to produce a plasma, into said ion source means, wherein ions leaving said ion source means in the form of an ion efflux have an energy of about 50 eV or less;

(b) providing a sputter target biased negative relative to ground, which is disposed in the ion efflux of said ion source means;

(c) positioning said deposition substrate in operative relation to said sputter target whereby said material sputtered from said sputter target is deposited onto said substrate; and (d) controlling the pressure of said gas within said volume such that said pressure is substantially less than the pressure of said gas within said ion source means.

* * * * *